United States Patent [19]

Gross

[11] 3,745,513

[45] July 10, 1973

[54] STRAIN RELIEVING ELECTRICAL CONNECTOR

[75] Inventor: Robert D. Gross, North Caldwell, N.J.

[73] Assignee: The Singer Company, Little Falls, N.J.

[22] Filed: Dec. 13, 1971

[21] Appl. No.: 207,197

[52] U.S. Cl. ........ 339/95 R, 174/68.5, 317/101 CC, 339/17 C, 339/275 B

[51] Int. Cl. ........ H01r 9/06

[58] Field of Search ........ 339/17, 18, 14, 95, 339/278, 220, 275; 317/101; 174/68.5

[56] References Cited

UNITED STATES PATENTS

| | | | |
|---|---|---|---|
| 1,697,954 | 1/1929 | Gribbie | 339/95 A |
| 3,686,625 | 8/1972 | Krehbiel, Sr. et al. | 339/278 C |
| 3,613,049 | 10/1971 | Niedzwiecki | 339/278 C |
| 3,249,910 | 5/1966 | Venn et al. | 174/88 R |
| 2,289,514 | 7/1942 | Mastney et al. | 317/101 CC |
| 2,968,780 | 1/1961 | Roswell | 339/95 D |
| 3,546,539 | 12/1970 | Wilcox, Jr. et al. | 317/101 CC |

*Primary Examiner*—Marvin A. Champion
*Assistant Examiner*—Terrell P. Lewis
*Attorney*—S. A. Giarratana, Thomas W. Kennedy and Charles R. Lepchinsky

[57] ABSTRACT

This invention describes a form of electrical connector to be used on printed circuit board assemblies which provides mechanical isolation from the effects of dynamic loading due to the different thermal expansions of the printed circuit board and the component leads and/or vibration. This is done by soldering a first loop of the connector to the printed circuit board and soldering the second loop of the connector to the component lead, and two loops being interconnected by a flexible member which minimizes force applied to the solder joint under dynamic loading conditions.

6 Claims, 3 Drawing Figures

STRAIN RELIEVING ELECTRICAL CONNECTOR

BACKGROUND OF THE INVENTION

This invention relates to an electrical connector, and, more particularly, to an electrical connector which provides strain relief to the solder connections made on printed circuit board assemblies.

The use of printed circuit boards and temperature cycling thereof in electronic equipment has placed new demands on soldered joints. The small area of the joint, coupled with the flexibility of the base laminate, has resulted in relatively large stresses being transmitted to the joint during dynamic loading. Such loading is most generally caused by the differences in thermal expansion of the component lead and the printed circuit board which can be constructed from various materials including glass-epoxy, polyphenylene oxide, and silicone glass — the thermal coefficient of expansion of glass-epoxy printed circuit board being approximately a factor of five different than most common component lead materials.

One remote problem which may result is that for the large temperature excursions encountered in airborne, space and missle applications viz. — 100° to 150° C, the different thermal expansions can generate sufficient force at the soldered juncture of the component lead and the terminal pad on the printed circuit board that the soldered joint fractures after several applications of such forces.

A more common problem however occurs with the repeated applications of stress to the soldered connection. Such repetition will cause joint failure to occur at stresses below the stresses which can be borne for one loading. This is the well known fatigue failure. It has been shown that thermal expansion mismatch can cause stresses above the yield strength of solder in the range of thermal excursion experienced by electronic equipment, resulting in a stress situation where a few hundred or less cycles can cause failure. See the final report submitted under NASA contract number NAS 8-21233, entitled "Development of Highly Reliable Soldered Joints for Printed Circuit Boards." Fatigue life of soldered joints is reduced not only by thermal fatigue from the cycling of materials with different thermal expansion characteristics, but also by restrictive attachments to one of the expanding members. Restrictive attachments reduce fatigue life because they accentuate the unfavorable movement due to differential expansion. In sophisticated modern day electronics' packages many boards are coated with encapsulants that protect the components from dirt, conductive particles, and moisture. If these coatings mechanically bridge the body of components to the board, they are harmful. This restraint of the expanding lead by protective-coating bridging, as well as use of other mechanical fasteners, adhesives, and/or hard spacers under components will all reduce the fatigue life of the solder joint due to thermal effects.

In addition to thermal expansion effects, similar degradation of solder joints occurs when printed circuit board assemblies are subjected to the high vibrational conditions to which certain modern day electronic assemblies are subjected.

Two basic design approaches exist with regard to the solution of this problem. One involves the increasing of the solder joint strength by placing various mesh-like devices over the component lead before soldering. The effect achieved would be similar to that achieved in reinforced concrete. These mechanical devices give the solder additional strength to withstand the repeated vibration and thermal cyclings. Theoretically, this approach does not eliminate the dynamic forces which are at play but increase the solder joint's resistance thereto. Theoretically, in time, this reinforced juncture should fail.

The second approach is the strain relief approach. An example of this approach is set forth in U.S. Pat. No. 3,321,570, wherein is described the use of a bellows like rivet one side of which is soldered to the printed circuit terminal pad and the other side of which is connected to the component lead. This approach is a relatively expensive approach which practically speaking would be most beneficial only in new designs. Other strain relief techniques include component lead bending, use of rubberized spacers under the components, reduced lead diameters and combinations of these. These approaches do not lend themselves readily in the area where one must retrofit an existing assembly with the added restraint of salvaging as many of the components as possible, nor are these approaches appropriate in those applications where high package densities are essential which is typically the case in military airborne applications.

SUMMARY OF THE INVENTION

Briefly summarized, the present invention relates to an electrical connector in which a first loop, concentrically aligned with the component lead, is soldered to a terminal pad on the printed circuit board assembly, provision being taken not to solder to the lead at this point, and in which a second loop, connected to the first loop by a flexible, electrically conductive member, is placed over the component lead and soldered thereto. Mechanical isolation is thereby provided between the printed circuit board and the component lead which relieves the stresses which normally occur when the component lead is soldered directly to the terminal pad.

It is therefore an object of this invention to provide a flexibly connected dual loop member which provides strain relief for soldered connections.

DESCRIPTION OF THE DRAWINGS

Reference is now made to the accompanying drawings for a better understanding of the nature and objects of the electrical connector. The drawings illustrate the best mode presently contemplated for carrying out the objects of the invention and its principles, and are not to be construed as restrictions of limitations on its scope. In the drawings.

DESCRIPTION OF THE PREFERRED EMBODIMENT

Figure 1:
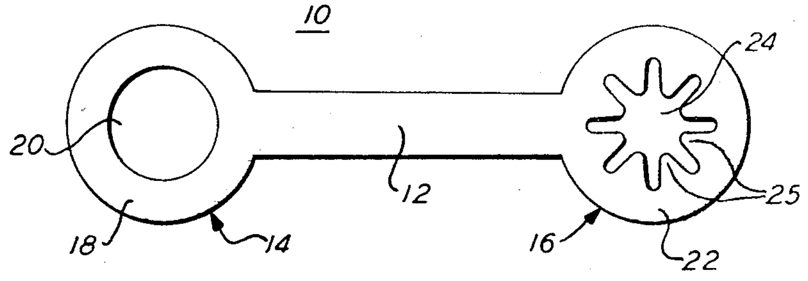
FIG. 1 is a plan view of the electrical connector of the present invention.

Referring specifically to the embodiment of FIG. 1, an electrical connector 10 is shown which is formed by strip 12 interconnecting in one piece fashion a first loop 14 and a second loop 16.

The strip 12 is contiguous on the one side with loop 14 which consists of an annular ring 18 circumscribing a hole 20. The hole 20 has a diameter slightly larger than an insulating sleeve 40 hereinbelow described.

The strip 12 is contiguous on the other side with loop 16 which consists of a pad 22 having a serrated opening 24. The radially inward extremities of the serrations 25 forming the opening 24 describe a circular locus of diameter less than that of the electrical component leads to which the loop 16 will be attached as hereinbelow described.

The connector 10 can be made in quantity in a manner identical to any of the numerous ways that a basic printed circuit board is made as e.g., photo etching process etc. It is important only that the connector be made of a non-brittle, solderable material and be of sufficient minimum thickness to allow for the connector to be formed in the manner depicted in FIG. 2. Such a metal which has been successfully used is beryllium cooper.

Figure 2:
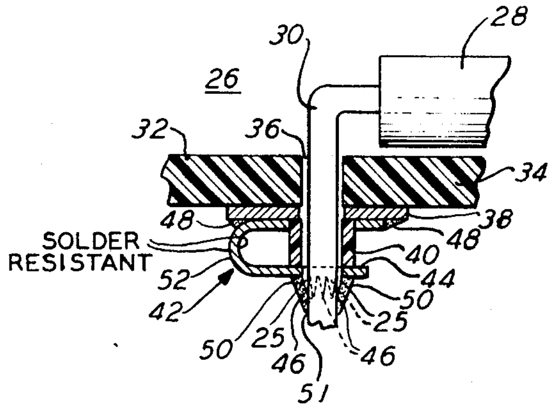
FIG. 2 is a partial sectional, elevation view of a preferred utilization of the present invention.

Referring to FIG. 2 there is shown a preferred method of using the connector shown in FIG. 1. FIG. 2 depicts a typical component installation 26 on a printed circuit board. A typical installation consists of an electrical component 28 having component leads 30 extending therefrom mounted on a printed circuit board 32. The printed circuit board which consists generally of an insulating layer 34 made of glass-epoxy or similar material and printed conductive paths (not shown) has a plurality of holes to accept said component leads of which hole 36 is typical. At least on the side of the printed circuit board opposite said electrical components said holes are circumscribed with terminal pads such as 38 which are connected to the appropriate conductive paths. The lead is inserted into the holes 36. An electrical insulating sleeve 40 is then inserted over the lead. The sleeve is cut to a predetermined length to allow for a minimum projection of the component lead beyond the end of the sleeve when it is flush to the board 32. This projection allows for an adequate engagement with loop 16 as hereinbelow described. This sleeve is made of a material with a melting point sufficiently high to avoid deformation when solder is applied. If the soldering technique to be employed is the well-known flow soldering technique then materials with melting points in excess of 500°F would be required. Such a material could be the well-known TEFLON, manufactured by the DuPont Company. After the insulating sleeve is placed over the component lead, loop 14 is placed over the sleeve and brought flush with the terminal pad 38. A bend 42 is then made in connector 10 so as to enable loop 16 to be coaxially aligned with the component lead 30. The loop 16 is pressed down on to the lead. Since the diameter of the locus of the radially inward extremities of the serrations 25 is less than the diameter of the component lead the serrations 25 are pushed downward or away from the under side of the printed circuit board. The loop 16 is pressed on to the lead until side 44 of the loop is flush with the insulating sleeve 40. The point-like tips 46 of serrations 25 are biased into the component lead thereby preventing the loop 16 from backing off from the component lead.

Solder 48 bonds the junction between loop 14 and pad 38 and solder 50 is used to bond the junction 51 of loop 16 and lead 30.

In order to prevent the strip portion 12, of connector 10, from electrically shorting out to any of the conductive paths passing under or immediately behind the bend 42 of the connector it may be desirable that the outboard side 52 of strip 12 be coated with an electrically insulating material which may be solder resistant for reasons hereinbelow set forth.

The connector can be made from spring like material. If this be the case, the first loop 14 is forced to remain flush with pad 38. This is so since the serrations 25 restrain movement of loop 16 so that the tendency of the connector to straighten itself results in a force being exerted on loop 14 maintaining it flush with pad 38. With this added characteristic and the solder resistant added to both sides of strip 12 the assembly can be readily flow soldered which is a desirable thing where large quantities of printed circuit assemblis are to be fabricated. The solder resistant is needed in these situations to prohibit solder from coating the strip. If solder were not prevented therefrom the flexibleness of the connector, which is the key element providing mechanical isolation of the junction 51 from the adverse affects of dynamic loading, would be to a large extent reduced.

Figure 3:
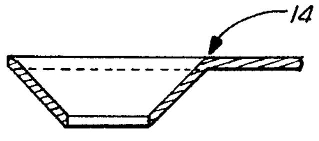
FIG. 3 is a sectional elevation view of an improvement in a portion of the electrical connector of FIG. 1.

It is to be appreciated that changes in the above embodiments can be made without departing from the scope of the present invention. For example, loop 14 of the connector can be formed in a dish-like fashion after manufacture, as shown in FIG. 3. This will facilitate inspection of the solder junction between the loop 14 and terminal pad 38. Other variations of the specific construction disclosed above can be made by those skilled in the art without departing from the invention as defined in the appended claims.

What is claimed is:

1. An electrical connector of solderable, non-brittle material for making a connection between a terminal pad on one side of a printed circuit board and a component lead protruding through said one side which comprises:
   - a first loop having a circular hole with a diameter larger than the diameter of said component lead,
   - a second loop having a serrated opening, the inward extremities of the serrations defining a circular locus having a diameter less than said component lead;
   - an insulating sleeve interposed between said terminal pad and said second loop ane aligned concentrically within the hole of said first loop; and
   - means for interconnecting the first and second loops.

2. The electrical connector of claim 1 wherein said interconnecting means is coated with an insulating material.

3. The electrical connector of claim 2 wherein said interconnecting means is made of flexible material.

4. The electrical connector of claim 3 wherein the material of fabrication is beryllium copper.

5. The electrical connector of claim 4 wherein said insulating sleeve has a melting point in excess of 500° F.

6. The electrical connector of claim 5 wherein said first loop is formed having a dish like profile.

* * * * *